(12) United States Patent
Zhang et al.

(10) Patent No.: US 11,732,872 B2
(45) Date of Patent: Aug. 22, 2023

(54) LIGHT-EMITTING SYSTEM FOR HEALTHY LIGHTING, LIGHT BAR AND LIGHT APPARATUS

(71) Applicant: FOSHAN NATIONSTAR OPTOELECTRONICS CO., LTD., Guangdong (CN)

(72) Inventors: Jinhui Zhang, Guangdong (CN); Long Zhao, Guangdong (CN); Yikai Yuan, Guangdong (CN); Jiajie Zeng, Guangdong (CN); Cheng Li, Guangdong (CN)

(73) Assignee: FOSHAN NATIONSTAR OPTOELECTRONICS CO., LTD., Guangdong (CN)

( * ) Notice: Subject to any disclaimer, the term of this patent is extended or adjusted under 35 U.S.C. 154(b) by 49 days.

(21) Appl. No.: 17/607,046

(22) PCT Filed: Dec. 12, 2019

(86) PCT No.: PCT/CN2019/124921
§ 371 (c)(1),
(2) Date: Oct. 28, 2021

(87) PCT Pub. No.: WO2020/220689
PCT Pub. Date: Nov. 5, 2020

(65) Prior Publication Data
US 2022/0205613 A1    Jun. 30, 2022

(30) Foreign Application Priority Data
Apr. 29, 2019 (CN) .......................... 201910356839.1

(51) Int. Cl.
*F21V 9/30* (2018.01)
*F21S 4/28* (2016.01)

(52) U.S. Cl.
CPC . *F21V 9/30* (2018.02); *F21S 4/28* (2016.01)

(58) Field of Classification Search
CPC .............................. F21V 9/38; H01L 33/504
See application file for complete search history.

(56) References Cited

U.S. PATENT DOCUMENTS

2009/0184624 A1\* 7/2009 Schmidt ................ C04B 37/001
                                                                    313/498
2013/0313516 A1    11/2013 David et al.
(Continued)

FOREIGN PATENT DOCUMENTS

CN         102939652 A    2/2013
CN         105144709 A    12/2015
(Continued)

*Primary Examiner* — Andrew J Coughlin
(74) *Attorney, Agent, or Firm* — Gang Yu

(57) ABSTRACT

A light-emitting system for healthy lighting, a light bar and a light fixture, wherein they are applied to the field of lighting and can emit white light with a color temperature range of 2700 K to 6500 K. A relative spectral power of the light-emitting system is set to be φ (λ), and a relative spectral power distribution of a solar spectral curve corresponding to the color temperature is set to be S (λ). The white light has a first characteristic waveband, and a wavelength region of the first characteristic waveband is 380-405 nm. The white light has a second characteristic waveband, and a wavelength region of the second characteristic waveband is 415-455 nm. The white light has a third characteristic waveband, and a wavelength region of the third characteristic waveband is 465-495 nm.

15 Claims, 3 Drawing Sheets

(56) References Cited

U.S. PATENT DOCUMENTS

| | | | | |
|---|---|---|---|---|
| 2014/0301062 A1* | 10/2014 | David | ............... | F21V 3/00 |
| | | | | 362/84 |
| 2015/0062892 A1* | 3/2015 | Krames | ............ | F21K 9/235 |
| | | | | 362/231 |
| 2019/0088833 A1* | 3/2019 | Itoga | ............... | H01L 33/50 |

FOREIGN PATENT DOCUMENTS

| | | | |
|---|---|---|---|
| CN | 107437576 | A | 12/2017 |
| CN | 107565006 | A | 1/2018 |
| CN | 108417701 | A | 8/2018 |
| CN | 108635274 | A | 10/2018 |
| CN | 108690618 | A | 10/2018 |
| CN | 109000160 | A | 12/2018 |
| CN | 109119411 | A | 1/2019 |
| CN | 109301055 | A | 2/2019 |
| CN | 110094649 | A | 8/2019 |
| WO | 2017131697 | A1 | 8/2017 |

* cited by examiner

LIGHT-EMITTING SYSTEM FOR HEALTHY LIGHTING, LIGHT BAR AND LIGHT APPARATUS

CROSS-REFERENCE TO RELATED APPLICATION

The present application claims the priority of Chinese patent application No. 201910356839.1 entitled "Light-emitting System for Healthy Lighting, Light Bar and Light Apparatus", filed on Apr. 29, 2019, which is incorporated in its entirety herein by reference.

TECHNICAL FIELD

The disclosure relates to a technical field of LED light-emitting system, and in particular to a light-emitting system for healthy lighting, a light bar and a light apparatus.

BACKGROUND

As people's requirements for light quality increase, more and more application scenarios increase higher requirements for light colors of light-emitting devices. At present, using a violet LED to excite blue, green, and red can obtain a continuous spectrum, which is closer to a solar spectrum and has better color rendering performance.

Studies have shown that some special wavebands in white light are harmful to a human body. For example, a near-ultraviolet waveband of 380 nm-405 nm can damage human eyes and cause cataracts; and a high-energy blue light waveband of 415 nm-455 nm can damage the human eyes and cause AMD, visual fatigue and myopia etc. In addition, further studies have shown that some special wavebands in the white light can regulate human circadian rhythms and emotions. For example, a waveband of 465 nm-495 nm can regulate secretion of melatonin, thereby regulating a human biological clock and human emotions.

SUMMARY

In view of the above defects, the present disclosure provides a light-emitting system for healthy lighting, a light bar and a light apparatus.

The solution to the technical problem of the present disclosure is as follows:

A light-emitting system for healthy lighting, wherein the light-emitting system is able to emit white light in a color temperature range of 2700 K-6500 K, and a relative spectral power of the light-emitting system is set to be $\phi(\lambda)$, and a relative spectral power distribution of a solar spectral curve corresponding to the color temperature is set to be $S(\lambda)$, wherein the solar spectral curve is a black body radiation curve corresponding to the color temperature when the color temperature is $\geq 2700$ K and $<5000$ K, the solar spectral curve is a CIE standard illuminant D curve corresponding to the color temperature when the color temperature is $\geq 5000$ K and $\leq 6500$ K, the white light has a first characteristic waveband, a wavelength region of the first characteristic waveband is 380 nm-405 nm, the white light has a second characteristic waveband, a wavelength region of the second characteristic waveband is 415 nm-455 nm, the white light has a third characteristic waveband, a wavelength region of the third characteristic waveband is 465 nm-495 nm, and the first characteristic waveband and the second characteristic waveband satisfy:

$$\int_{380}^{405}\Phi(\lambda)d\lambda / \int_{380}^{780}\Phi(\lambda)d\lambda \leq 1\%,$$

$$\int_{415}^{455}\Phi(\lambda)d\lambda / \int_{380}^{780}\Phi(\lambda)d\lambda \leq 15\%;$$

normalizing is performed on the third characteristic waveband to satisfy:

$$70\% \leq \int_{465}^{495} \frac{\Phi(\lambda)}{\Phi(\lambda_{555})} d\lambda \bigg/ \int_{465}^{495} \frac{S(\lambda)}{S(\lambda_{555})} d\lambda \leq 120\%;$$

wherein $\phi(\lambda_{555})$ denotes a relative spectral power of the light-emitting system when the wavelength $\lambda$ is 555 nm, and $S(\lambda_{555})$ denotes a relative spectral power of the solar spectrum curve when the wavelength $\lambda$ is 555 nm.

That is, it can be seen from the above formula that an energy proportion of the first characteristic waveband is less than or equal to 1%, and an energy proportion of the second characteristic waveband is less than or equal to 15%.

In order to make a color quality of the light-emitting system better, a further preferred situation includes:

The first characteristic waveband satisfies:

$$\int_{380}^{405}\Phi(\lambda)d\lambda / \int_{380}^{780}\Phi(\lambda)d\lambda \leq 0.5\%;$$

the second characteristic waveband further satisfies:

$$\int_{415}^{455}\Phi(\lambda)d\lambda / \int_{380}^{780}\Phi(\lambda)d\lambda \leq 10\%;$$

the third characteristic waveband further satisfies:

$$80\% \leq \int_{465}^{495} \frac{\Phi(\lambda)}{\Phi(\lambda_{555})} d\lambda \bigg/ \int_{465}^{495} \frac{S(\lambda)}{S(\lambda_{555})} d\lambda \leq 110\%.$$

Further, a spectrum emitted by the light-emitting system for healthy lighting has the following characteristics in part of wavelength regions: when $\lambda$ is in a wavelength region of 430 nm-500 nm, an integral ratio relationship between $\phi(\lambda)$ and $S(\lambda)$ satisfies:

$$80\% \leq \int_{430}^{500} \frac{\Phi(\lambda)}{\Phi(\lambda_{555})} d\lambda \bigg/ \int_{430}^{500} \frac{S(\lambda)}{S(\lambda_{555})} d\lambda \leq 120\%;$$

when $\lambda$ is in a wavelength region of 500 nm-600 nm, an integral ratio relationship between $\phi(\lambda)$ and $S(\lambda)$ satisfies:

$$80\% \leq \int_{500}^{600} \frac{\Phi(\lambda)}{\Phi(\lambda_{555})} d\lambda \bigg/ \int_{500}^{600} \frac{S(\lambda)}{S(\lambda_{555})} d\lambda \leq 120\%;$$

when $\lambda$ is in a wavelength region of 600 nm-700 nm, an integral ratio relationship between $\phi(\lambda)$ and $S(\lambda)$ satisfies:

$$70\% \leq \int_{600}^{700} \frac{\Phi(\lambda)}{\Phi(\lambda_{555})} d\lambda \bigg/ \int_{600}^{700} \frac{S(\lambda)}{S(\lambda_{555})} d\lambda \leq 110\%.$$

The light-emitting system emits white light when phosphors are excited by a chip with a main emission peak of 380 nm-430 nm. The phosphors are composed of a blue phosphor (having a main emission peak of 430 nm-500 nm and a full width at half maximum (FWHM) of 20 nm-100 nm), a green phosphor (having a main emission peak of 480 nm-550 nm and a FWHM of 20 nm-80 nm), a yellow phosphor (having a main emission peak of 540 nm-600 nm and a FWHM of 60 nm-120 nm), and a red phosphor (having a main emission peak of 600 nm-700 nm and a FWHM of 80 nm-120 nm), wherein, the blue phosphor is aluminate, chlorophosphate or silicate and further includes $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$; the green phosphor is oxynitride, silicate or aluminate and further includes $SiAlON:Eu^{2+}$, $BaSiON_2:Eu^{2+}$, $Ba_2SiO_4:Eu^{2+}$ or LuAG; the yellow phosphor is aluminate, silicate or nitride and further includes Ga-YAG, $Sr_2SiO_4:Eu^{2+}$, $(BaSr)_2SiO_4:Eu^{2+}$ or $La_3Si_6N_{11}:Ce^{3+}$; and the red phosphor is nitride, sulfide or fluoride and further includes $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

A light bar, wherein the light bar has the light-emitting system described in the above technical solutions.

A light apparatus, wherein the light bar has the light-emitting system described in the above technical solution.

The advantages of the present disclosure are: by limiting the first characteristic waveband, the second characteristic waveband and the third characteristic waveband, the lighting system achieves the output of white light, and also reduces spectra that are harmful to a human body, and increases spectra that are beneficial to the human body, thereby achieving healthy lighting. The light-emitting system can be applied to a LED light-emitting system. Alight bar and a light apparatus are provided, wherein the light bar and the light apparatus have the beneficial effects of the light-emitting system.

BRIEF DESCRIPTION OF THE DRAWINGS

In order to illustrate the technical solutions in the embodiments of the present disclosure more clearly, the following will briefly describe the accompany drawings needed in the description of the embodiments. Obviously, the drawings described are only a part of the embodiments of the present disclosure, rather than all the embodiments, and a person skilled in the art can also obtain other design solutions and drawings based on these drawings without creative work.

DETAILED DESCRIPTION OF THE EMBODIMENTS

Figure 1:
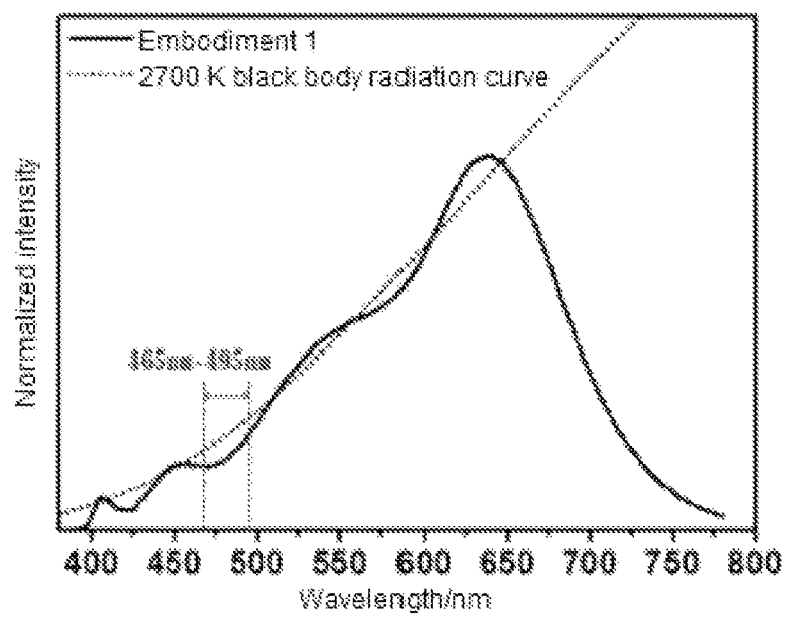
FIG. 1 is a comparison diagram between a light-emitting system made in embodiment 1 and a 2700 K black body radiation curve.

The concept, specific structure, and resulted technical effects of the present disclosure will be described clearly and completely below with reference to the embodiments and the accompanying drawings, so as to fully understand the purpose, features and effects of the present disclosure. Obviously, the described embodiments are only a part of the embodiments of the present disclosure, rather than all the embodiments. Based on the embodiments of the present disclosure, other embodiments obtained by a person skilled in the art without creative work belong to the claimed scope of the present disclosure. In addition, all the coupling/connection relationships mentioned herein do not only refer to a direct connection of components, but refer to a better connection structure by adding or reducing connection accessories as claimed in a specific implementation. The various technical features in the present disclosure can be combined interactively on the premise of not conflicting with each other.

Embodiment 1: Alight-emitting system for healthy lighting. Light is emitted when phosphors are excited by an ultraviolet chip with a main emission peak of 380 nm-430 nm, wherein the phosphors are calculated in parts by weight and is a mixture of 45.0% $MgSr_3Si_2O_8:Eu^{2+}$, 25.0% $BaSiON_2:Eu^{2+}$, 20.0% $Sr_2SiO_4:Eu^{2+}$, and 10.0% $CaAlSiN_3:Eu^{2+}$.

A light-emitting system with a color temperature of 2700 K is made. A light-emitting spectrum of the light-emitting system has a first characteristic waveband with a wavelength region of 380 nm-405 nm, and the first characteristic waveband satisfies:

$$\int_{380}^{405}\Phi(\lambda)d\lambda/\int_{380}^{780}\Phi(\lambda)d\lambda \le 1\%;$$

it also has a second characteristic waveband with a wavelength region of 415 nm-455 nm, and the second characteristic waveband satisfies:

$$\int_{415}^{455}\Phi(\lambda)d\lambda/\int_{380}^{780}\Phi(\lambda)d\lambda \le 15\%;$$

it further has a third characteristic waveband with a wavelength region of 465 nm-495 nm, and the third characteristic waveband satisfies:

$$70\% \le \int_{465}^{495}\frac{\Phi(\lambda)}{\Phi(\lambda_{555})}d\lambda \bigg/ \int_{465}^{495}\frac{S(\lambda)}{S(\lambda_{555})}d\lambda \le 120\%.$$

Embodiment 2: Alight-emitting system for healthy lighting. Light is emitted when phosphors are excited by an ultraviolet chip with a main emission peak of 380 nm-430 nm, wherein the phosphors are calculated in parts by weight and is a mixture of 50.0% $MgSr_3Si_2O_8:Eu^{2+}$, 23.6% $BaSiON_2:Eu^{2+}$, 18.0% $Sr_2SiO_4:Eu^{2+}$, and 8.4% $CaAlSiN_3:Eu^{2+}$.

A light-emitting system with a color temperature of 3000 K is made. A light-emitting spectrum of the light-emitting system has a first characteristic waveband with a wavelength region of 380 nm-405 nm, and the first characteristic waveband satisfies:

$$\int_{380}^{405}\Phi(\lambda)d\lambda/\int_{380}^{780}\Phi(\lambda)d\lambda \le 0.5\%;$$

it also has a second characteristic waveband with a wavelength region of 415 nm-455 nm, and the second characteristic waveband satisfies:

$$\int_{415}^{455}\Phi(\lambda)d\lambda/\int_{380}^{780}\Phi(\lambda)d\lambda \le 15\%;$$

it further has a third characteristic waveband with a wavelength region of 465 nm-495 nm, and the third characteristic waveband satisfies:

$$70\% \leq \int_{465}^{495} \frac{\Phi(\lambda)}{\Phi(\lambda_{555})}d\lambda \Big/ \int_{465}^{495} \frac{S(\lambda)}{S(\lambda_{555})}d\lambda \leq 120\%.$$

Embodiment 3: A light-emitting system for healthy lighting. Light is emitted when phosphors are excited by an ultraviolet chip with a main emission peak of 380 nm-430 nm, wherein the phosphors are calculated in parts by weight and is a mixture of 69.3% $MgSr_3Si_2O_8:Eu^{2+}$, 14.9% $BaSiON_2:Eu^{2+}$, 8.4% $Sr_2SiO_4:Eu^{2+}$, and 7.4% $CaAlSiN_3:Eu^{2+}$.

A light-emitting system with a color temperature of 4000 K is made. A light-emitting spectrum of the light-emitting system has a first characteristic waveband with a wavelength region of 380 nm-405 nm, and the first characteristic waveband satisfies:

$\int_{380}^{405}\Phi(\lambda)d\lambda/\int_{380}^{780}\Phi(\lambda)d\lambda \leq 0.5\%$;

sit also has a second characteristic waveband with a wavelength region of 415 nm-455 nm, and the second characteristic waveband satisfies:

$\int_{415}^{455}\Phi(\lambda)d\lambda/\int_{380}^{780}\Phi(\lambda)d\lambda \leq 10\%$;

it further has a third characteristic waveband with a wavelength region of 465 nm-495 nm, and the third characteristic waveband satisfies:

$$70\% \leq \int_{465}^{495} \frac{\Phi(\lambda)}{\Phi(\lambda_{555})}d\lambda \Big/ \int_{465}^{495} \frac{S(\lambda)}{S(\lambda_{555})}d\lambda \leq 120\%.$$

Embodiment 4: A light-emitting system for healthy lighting. Light is emitted when phosphors are excited by an ultraviolet chip with a main emission peak of 380 nm-430 nm, wherein the phosphors are calculated in parts by weight and is a mixture of 75.4% $MgSr_3Si_2O_8:Eu^{2+}$, 12.1% $BaSiON_2:Eu^{2+}$, 7.5% $Sr_2SiO_4:Eu^{2+}$, and 4.9% $CaAlSiN_3:Eu^{2+}$.

A light-emitting system with a color temperature of 5000 K is made. A light-emitting spectrum of the light-emitting system has a first characteristic waveband with a wavelength region of 380 nm-405 nm, and the first characteristic waveband satisfies:

$\int_{380}^{405}\Phi(\lambda)d\lambda/\int_{380}^{780}\Phi(\lambda)d\lambda \leq 0.5\%$;

it also has a second characteristic waveband with a wavelength region of 415 nm-455 nm, and the second characteristic waveband satisfies:

$\int_{415}^{455}\Phi(\lambda)d\lambda/\int_{380}^{780}\Phi(\lambda)d\lambda \leq 15\%$;

it further has a third characteristic waveband with a wavelength region of 465 nm-495 nm, and the third characteristic waveband satisfies:

$$80\% \leq \int_{465}^{495} \frac{\Phi(\lambda)}{\Phi(\lambda_{555})}d\lambda \Big/ \int_{465}^{495} \frac{S(\lambda)}{S(\lambda_{555})}d\lambda \leq 110\%.$$

Embodiment 5: A light-emitting system for healthy lighting. Light is emitted when phosphors are excited by an ultraviolet chip with a main emission peak of 380 nm-430 nm, wherein the phosphors are calculated in parts by weight and is a mixture of 85.0% $MgSr_3Si_2O_8:Eu^{2+}$, 6.0% $BaSiON_2:Eu^2$, 6.0% $Sr_2SiO_4:Eu^{2+}$, and 3.0% $CaAlSiN_3:Eu^{2+}$.

A light-emitting system with a color temperature of 6500 K is made. A light-emitting spectrum of the light-emitting system has a first characteristic waveband with a wavelength region of 380 nm-405 nm, and the first characteristic waveband satisfies:

$\int_{380}^{405}\Phi(\lambda)d\lambda/\int_{380}^{780}\Phi(\lambda)d\lambda \leq 1\%$;

it also has a second characteristic waveband with a wavelength region of 415 nm-455 nm, and the second characteristic waveband satisfies:

$\int_{415}^{455}\Phi(\lambda)d\lambda/\int_{380}^{780}\Phi(\lambda)d\lambda \leq 10\%$;

it further has a third characteristic waveband with a wavelength region of 465 nm-495 nm, and the third characteristic waveband satisfies:

$$70\% \leq \int_{465}^{495} \frac{\Phi(\lambda)}{\Phi(\lambda_{555})}d\lambda \Big/ \int_{465}^{495} \frac{S(\lambda)}{S(\lambda_{555})}d\lambda \leq 120\%.$$

The light-emitting systems prepared in embodiments 1 to 5 are tested and compared, and the followings are obtained: color quality parameters (see Table 1) of the light-emitting systems with different color temperatures, R1-R8 values (see Table 2) of different color temperatures, R9-R15 values (see Table 3) of different color temperatures, energy proportions (see Table 4) of harmful wavebands (the first characteristic waveband and the second characteristic waveband) of the light-emitting systems with respective color temperatures, a ratio (see Table 5) of a characteristic long-wave blue light waveband (the third characteristic waveband) of the light-emitting systems with respective color temperatures and a solar spectrum curve, and a ratio (see Table 6) of the integral of each waveband of the lighting systems with respective color temperatures to the solar spectrum curve.

Among them, Table 1 is a table of the color quality parameters of the light-emitting systems with different color temperatures. Among them, Ra: a general color rendering index, Rf: a color fidelity index and Rg: a color saturation index:

TABLE 1

| Color temperature/K | Embodiment | Rf | Rg | Ra |
|---|---|---|---|---|
| 2700 | 1 | 96.1 | 99.7 | 98.0 |
| 3000 | 2 | 96.4 | 100.7 | 97.3 |
| 4000 | 3 | 96.7 | 99.4 | 98.8 |
| 5000 | 4 | 96.2 | 100.5 | 96.8 |
| 6500 | 5 | 95.1 | 98.5 | 95.4 |

Table 2 is a parameter table of R1-R8 values (color rendering indexes) for different color temperatures:

TABLE 2

| Color temperature/K | Embodiment | R1 | R2 | R3 | R4 | R5 | R6 | R7 | R8 |
|---|---|---|---|---|---|---|---|---|---|
| 2700 | 1 | 98.7 | 98.7 | 93.7 | 96.3 | 99.1 | 99.3 | 98.8 | 99.0 |
| 3000 | 2 | 96.3 | 98.4 | 97.8 | 95.0 | 96.2 | 96.1 | 99.6 | 99.0 |
| 4000 | 3 | 98.9 | 99.5 | 97.9 | 98.6 | 99.1 | 99.2 | 98.5 | 98.8 |
| 5000 | 4 | 95.9 | 96.8 | 98.6 | 96.8 | 95.9 | 95.2 | 97.6 | 97.3 |
| 6500 | 5 | 95.3 | 96.2 | 95.0 | 95.5 | 95.0 | 94.2 | 97.3 | 94.9 |

Table 3 is a parameter table of R9-R15 values for different color temperatures:

TABLE 3

| Color temperature/K | R9 | R10 | R11 | R12 | R13 | R14 | R15 |
|---|---|---|---|---|---|---|---|
| 2700 | 93.7 | 95.0 | 94.4 | 95.5 | 99.2 | 95.3 | 99.0 |
| 3000 | 98.5 | 97.3 | 91.9 | 95.7 | 96.6 | 97.9 | 98.2 |
| 4000 | 98.0 | 98.8 | 98.7 | 92.8 | 98.8 | 98.1 | 98.8 |
| 5000 | 91.8 | 93.3 | 95.4 | 93.0 | 95.9 | 99.1 | 96.0 |
| 6500 | 90.0 | 90.0 | 95.1 | 90.0 | 95.9 | 97.2 | 95.1 |

Table 4 shows the energy proportions of the harmful wavebands of the light-emitting systems with respective color temperatures:

TABLE 4

| Embodiment | 1 | 2 | 3 | 4 | 5 |
|---|---|---|---|---|---|
| Color temperature/K | 2700 | 3000 | 4000 | 5000 | 6500 |
| 380-405 nm | 0.42% | 0.06% | 0.18% | 0.12% | 0.06% |
| 415-455 nm | 3.2% | 5.2% | 7.3% | 10.6% | 13.6% |

Table 5 shows the ratio of the characteristic long-wave blue waveband of the light-emitting systems with respective color temperatures and the solar spectrum curve:

TABLE 5

| Embodiment | 1 | 2 | 3 | 4 | 5 |
|---|---|---|---|---|---|
| Color temperature/K | 2700 | 3000 | 4000 | 5000 | 6500 |
| 465-495 | 78.1% | 93.5% | 98.0% | 106.6% | 84.5% |

Table 6 shows the ratio of the integral of each waveband of the lighting systems with respective color temperatures and the solar spectrum curve:

TABLE 6

| Embodiment | 1 | 2 | 3 | 4 | 5 |
|---|---|---|---|---|---|
| Color temperature /K | 2700 | 3000 | 4000 | 5000 | 6500 |
| 430-500 nm | 85% | 98% | 98% | 106% | 95% |
| 500-600 nm | 99% | 101% | 100% | 101% | 97% |
| 600-700 nm | 81% | 85% | 85% | 91% | 77% |

Figure 2:
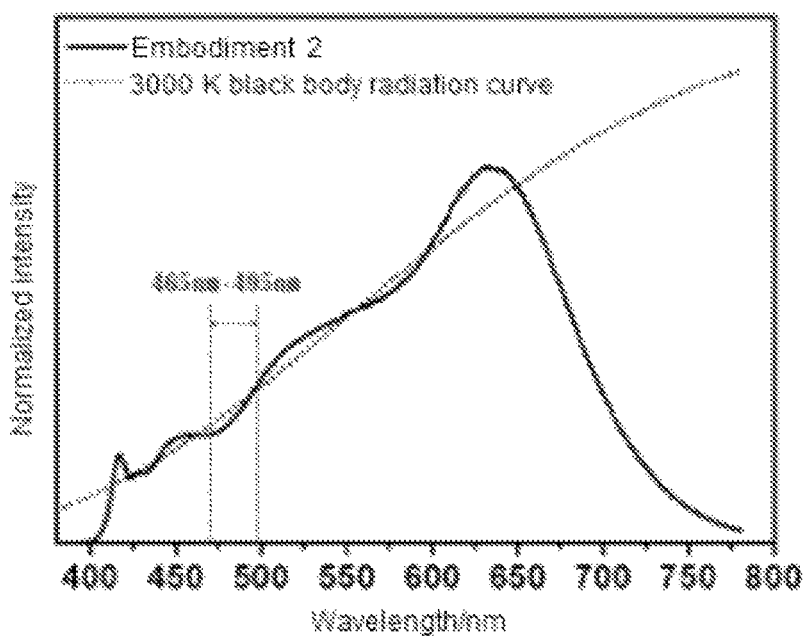
FIG. 2 is a comparison diagram between a light-emitting system made in embodiment 2 and a 3000 K black body radiation curve.
Figure 3:
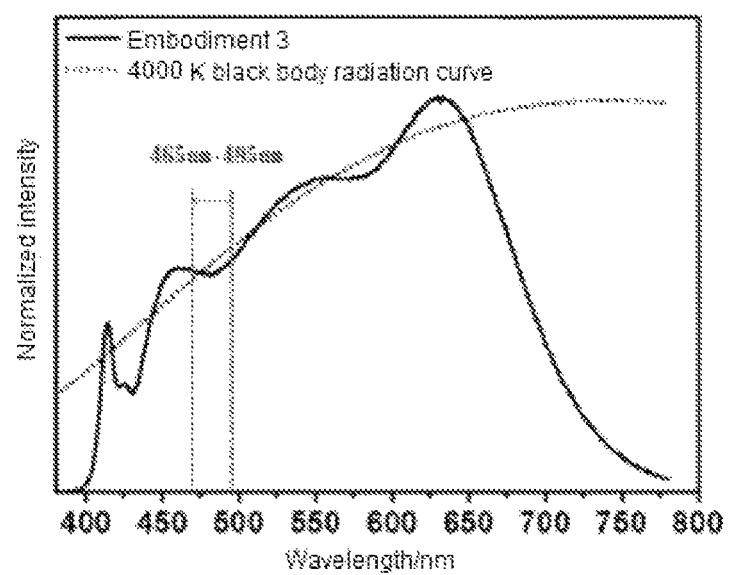
FIG. 3 is a comparison diagram between a lighting-emitting system made in embodiment 3 and a 4000 K black body radiation curve.
Figure 4:
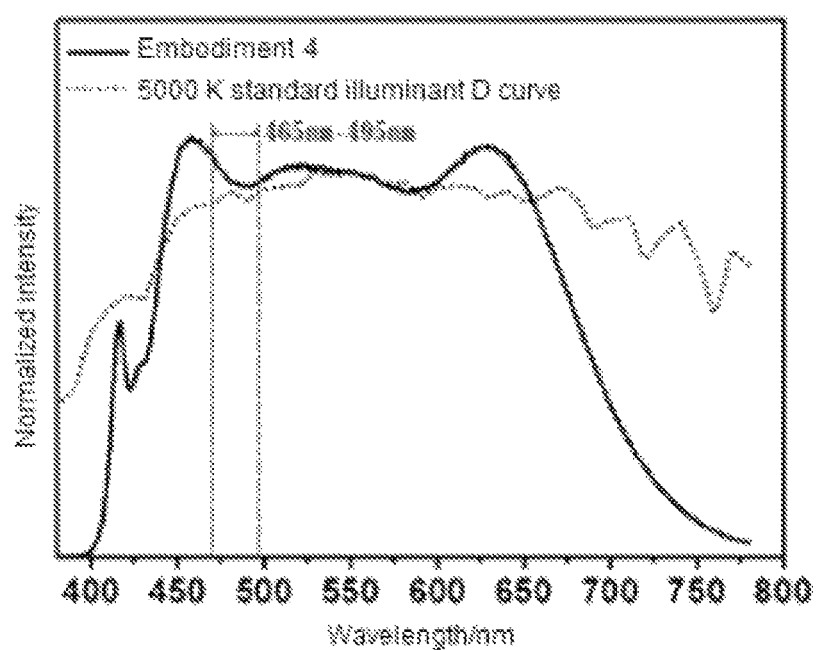
FIG. 4 is a comparison diagram between a light-emitting system made in embodiment 4 and a 5000 K standard illuminant D curve.
Figure 5:
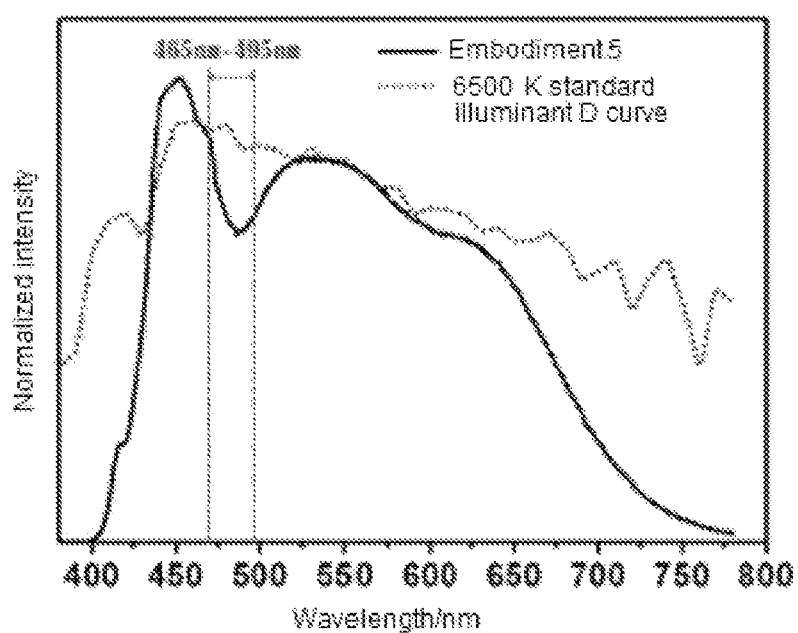
FIG. 5 is a comparison diagram between a light-emitting system made in embodiment 5 and a 6500 K standard illuminant D curve.

Among them, optical curve diagrams of the light-emitting systems prepared in Embodiments 1-5 are shown in FIGS. 1-5.

Through research, the first characteristic waveband (380 nm-405 nm) is a near-ultraviolet waveband UVA, and the second characteristic waveband (415 nm-455 nm) is a high-energy blue light waveband HEV. These two characteristic wavebands are harmful to retina or skin of a human body. Through the above-mentioned embodiments, the present application creatively reduces the energy proportions of the first characteristic waveband and the second characteristic waveband while realizing the output of white light, thereby reducing the damage of the light-emitting system to the retina and skin of the human body. The third characteristic waveband (465 nm-495 nm) has an effect on circadian rhythms of the human body. When this waveband is similar to the solar spectrum curve, it can adjust the circadian rhythms of the human body optimally. The present application creatively limits the third characteristic waveband while realizing the output of the white light, so that the waveband is similar to the solar spectrum curve. Moreover, the light-emitting system of the present application achieves relatively good effects in terms of color quality.

A light bar, wherein the light bar has the light-emitting system described in the above-mentioned embodiments.

A light apparatus, wherein the light apparatus has the light emitting system described in the above embodiments.

By arranging the light-emitting system in the above embodiments on the light bar and the light apparatus, the light bar and the light apparatus can emit a spectrum that is beneficial to the human body, thereby realizing healthy lighting.

The preferred implementations of the present disclosure are described in detail above, but the present disclosure is not limited to the embodiments. A person skilled in the art can make various equivalent variations or substitutions without departing from the spirit of the present disclosure. These equivalent variations or substitutions are all included in the scope defined by the claims of the present application.

What is claimed is:

1. A light-emitting system for healthy lighting, wherein the light-emitting system is able to emit white light in a color temperature range of 2700 K-6500 K, and a relative spectral power of the light-emitting system is set to be $\phi(\lambda)$, and a relative spectral power distribution of a solar spectral curve corresponding to the color temperature is set to be $S(\lambda)$, wherein the solar spectral curve is a black body radiation curve corresponding to the color temperature when the color temperature is $\geq 2700$ K and $<5000$ K, the solar spectral curve is a CIE standard illuminant D curve corresponding to the color temperature when the color temperature is $\geq 5000$ K and $\leq 6500$ K, the white light has a first characteristic waveband, a wavelength region of the first characteristic waveband is 380 nm-405 nm, the white light has a second characteristic waveband, a wavelength region of the second characteristic waveband is 415 nm-455 nm, the white light has a third characteristic waveband, a wavelength region of the third characteristic waveband is 465 nm-495 nm, and the first characteristic waveband and the second characteristic waveband satisfy:

$$\int_{380}^{405}\Phi(\lambda)d\lambda / \int_{380}^{780}\Phi(\lambda)d\lambda \leq 1\%,$$

$$\int_{415}^{455}\Phi(\lambda)d\lambda / \int_{380}^{780}\Phi(\lambda)d\lambda \leq 15\%;$$

normalizing is performed on the third characteristic waveband to satisfy:

$$70\% \leq \int_{465}^{495}\frac{\Phi(\lambda)}{\Phi(\lambda_{555})}d\lambda \bigg/ \int_{465}^{495}\frac{S(\lambda)}{S(\lambda_{555})}d\lambda \leq 120\%;$$

wherein $\phi(\lambda_{555})$ denotes a relative spectral power of the light-emitting system when the wavelength $\lambda$ is 555 nm, and $S(\lambda_{555})$ denotes a relative spectral power of the solar spectral curve when the wavelength $\lambda$ is 555 nm.

2. The lighting-emitting system for health lighting as claimed in claim 1, wherein the first characteristic waveband further satisfies:

$$\int_{380}^{405}\Phi(\lambda)d\lambda / \int_{380}^{780}\Phi(\lambda)d\lambda \leq 0.5\%;$$

3. The light-emitting system for healthy lighting as claimed in claim 1, wherein the second characteristic waveband further satisfies:

$$\int_{415}^{455} \Phi(\lambda)d\lambda / \int_{380}^{780} \Phi(\lambda)d\lambda \leq 10\%.$$

4. The light-emitting system for healthy lighting as claimed in claim 1, wherein the third characteristic waveband further satisfies:

$$80\% \leq \int_{465}^{495} \frac{\Phi(\lambda)}{\Phi(\lambda_{555})} d\lambda / \int_{465}^{495} \frac{S(\lambda)}{S(\lambda_{555})} d\lambda \leq 110\%.$$

5. The light-emitting system for healthy lighting as claimed in claim 1, wherein an integral ratio relationship between $\phi(\lambda)$ and $S(\lambda)$ satisfies a following formula when $\lambda$ is in a wavelength region of 430 nm-500 nm:

$$80\% \leq \int_{430}^{500} \frac{\Phi(\lambda)}{\Phi(\lambda_{555})} d\lambda / \int_{430}^{500} \frac{S(\lambda)}{S(\lambda_{555})} d\lambda \leq 120\%.$$

6. The light-emitting system for healthy lighting as claimed in claim 1, wherein an integral ratio relationship between $\phi(\lambda)$ and $S(\lambda)$ satisfies a following formula when $\lambda$ is in a wavelength region of 500 nm-600 nm:

$$80\% \leq \int_{500}^{600} \frac{\Phi(\lambda)}{\Phi(\lambda_{555})} d\lambda / \int_{500}^{600} \frac{S(\lambda)}{S(\lambda_{555})} d\lambda \leq 120\%.$$

7. The light-emitting system for healthy lighting as claimed in claim 1, wherein an integral ratio relationship between $\phi(\lambda)$ and $S(\lambda)$ satisfies a following formula when $\lambda$ is in a wavelength region of 600 nm-700 nm:

$$70\% \leq \int_{600}^{700} \frac{\Phi(\lambda)}{\Phi(\lambda_{555})} d\lambda / \int_{600}^{700} \frac{S(\lambda)}{S(\lambda_{555})} d\lambda \leq 110\%.$$

8. The light-emitting system for healthy lighting as claimed in claim 1, wherein the light-emitting system emits light when phosphors are excited by a chip with a main emission peak of 380 nm-430 nm, wherein the phosphors are composed of a blue phosphor with a main emission peak of 430 nm-500 nm and a FWHM of 20 nm-100 nm, a green phosphor with a main emission peak of 480 nm-550 nm and a FWHM of 20 nm-80 nm, a yellow phosphor with a main emission peak of 540 nm-600 nm and a FWHM of 60 nm-120 nm, and a red phosphor with a main emission peak of 600 nm-700 nm and a FWHM of 80 nm-120 nm.

9. The light-emitting system for healthy lighting as claimed in claim 8, wherein the blue phosphor is aluminate, chlorophosphate or silicate; the green phosphor is oxynitride, silicate or aluminate; the yellow phosphor is aluminate, silicate or nitride; and the red phosphor is nitride, sulfide or fluoride.

10. The light-emitting system for healthy lighting as claimed in claim 9, wherein the blue phosphor is $BaMgAl_{10}O_{17}:Eu^{2+}$, $BaAl_{12}O_9:Eu^{2+}$, $Sr_5(PO_4)_3Cl:Eu^{2+}$, $Ba_5(PO_4)_3Cl:Eu^{2+}$, $RbNa_3(Li_3SiO_4)_4:Eu^{2+}$ or $MgSr_3Si_2O_8:Eu^{2+}$.

11. The light-emitting system for healthy lighting as claimed in claim 9, wherein the green phosphor is $SiAlON:Eu^{2+}$, $BaSiON_2:Eu^{2+}$, $Ba_2SiO_4:Eu^{2+}$ or LuAG.

12. The light-emitting system for healthy lighting as claimed in claim 9, wherein the yellow phosphor is Ga-YAG, $Sr_2SiO_4:Eu^{2+}$, $(BaSr)_2SiO_4:Eu^{2+}$ or $La_3Si_6N_{11}:Ce^{3+}$.

13. The light-emitting system for healthy lighting as claimed in claim 9, wherein the red phosphor is $CaAlSiN_3:Eu^{2+}$, $(Ca_{1-x}Sr_x)AlSiN_3:Eu^{2+}$, $Ca_2Si_5N_8:Eu^{2+}$, $Sr_2Si_5N_8:Eu^{2+}$, $Ba_2Si_5N_8:Eu^{2+}$, $CaS:Eu^{2+}$ or $MgGeF_6:Mn^{4+}$.

14. A light bar, wherein the light bar comprises the light-emitting system as claimed in claim 1.

15. A light apparatus, wherein the light apparatus comprises the light-emitting system as claimed in claim 1.

* * * * *